(12) United States Patent
Kashiwazaki

(10) Patent No.: US 7,129,586 B2
(45) Date of Patent: Oct. 31, 2006

(54) FLIP CHIP PACKAGING STRUCTURE AND RELATED PACKAGING METHOD

(75) Inventor: Atsushi Kashiwazaki, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/874,289

(22) Filed: Jun. 24, 2004

(65) Prior Publication Data
US 2004/0262753 A1  Dec. 30, 2004

(30) Foreign Application Priority Data
Jun. 27, 2003  (JP) .............................. 2003-185860

(51) Int. Cl.
*H01L 23/48* (2006.01)
(52) U.S. Cl. .................................... 257/778
(58) Field of Classification Search ................ 257/738, 257/753, 774, 778, 779, 780, 789; 438/614, 438/611, 106, 108, 778, 787; 228/180.22
See application file for complete search history.

(56) References Cited

U.S. PATENT DOCUMENTS 6,425,516 B1 * 7/2002 Iwatsu et al. .......... 228/180.22
6,448,665 B1 * 9/2002 Nakazawa et al. .......... 257/789
6,551,854 B1 * 4/2003 Hosomi et al. ............. 438/106
6,798,072 B1 * 9/2004 Kajiwara et al. ........... 257/778

FOREIGN PATENT DOCUMENTS

| JP | 53-62471 | 6/1978 |
| JP | 64-81264 | 3/1989 |
| JP | 5-235099 | 9/1993 |
| JP | 11-204913 | 7/1999 |

* cited by examiner

*Primary Examiner*—Howard Weiss
*Assistant Examiner*—(Vikki) Hoa B. Trinh
(74) *Attorney, Agent, or Firm*—Posz Law Group, PLC

(57) ABSTRACT

A bump is formed on a bonding pad provided on a substrate. A passivation film covering a bonding pad provided on a semiconductor chip is provided with two apertures in which bumps are formed. The bump provided on the substrate advances and enters into a clearance between these bumps provided on the semiconductor chip when the semiconductor chip is packaged with the substrate.

10 Claims, 16 Drawing Sheets

X SHEARING DIRECTION OF THERMAL STRESS

X
SHEARING DIRECTION OF THERMAL STRESS

FIG. 13
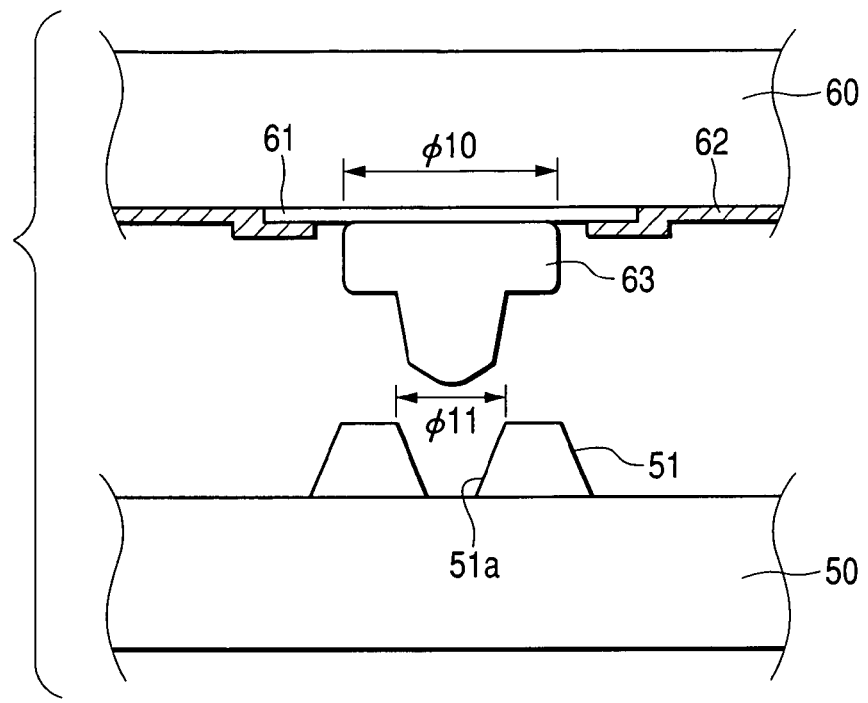
FIG. 14A
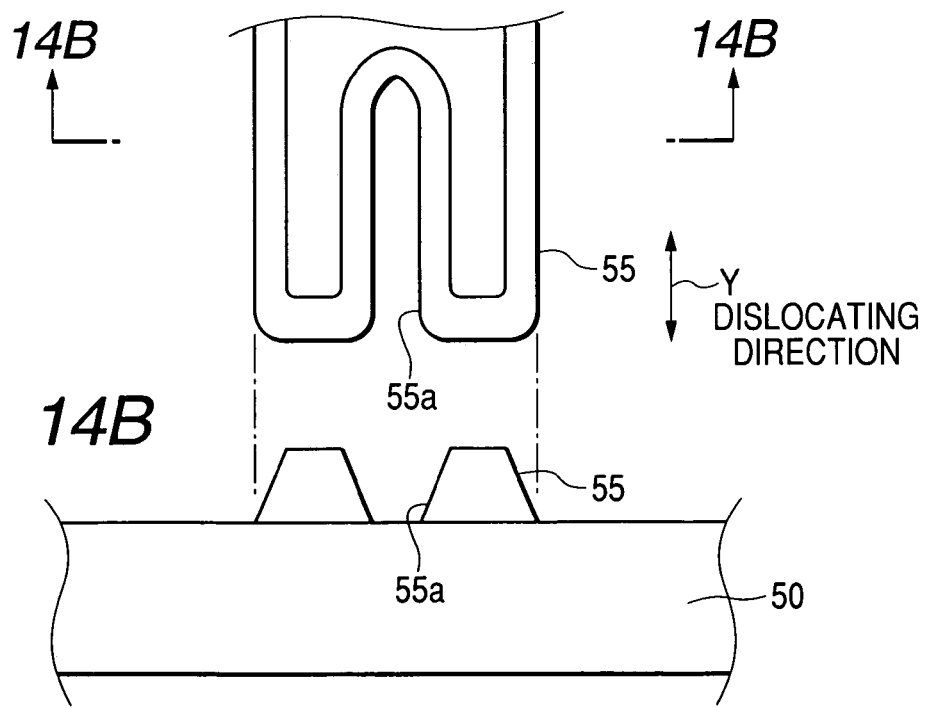
FIG. 14B

FLIP CHIP PACKAGING STRUCTURE AND RELATED PACKAGING METHOD

CROSS REFERENCE TO RELATED APPLICATION

This application is based on and incorporates herein by reference Japanese Patent Application No. 2003-185860 filed on Jun. 27, 2003.

BACKGROUND OF THE INVENTION

The present invention relates to a flip chip packaging structure and a related packaging method.

As shown in FIG. 19, a flip chip packaging technique is applicable to a bonding structure between a semiconductor chip 110 and a substrate 100. According to the structure shown in FIG. 19, a pad 111 is formed on an active face of the semiconductor chip 110. A bump 112, formed on the pad 111, serves as a bonding member for connecting the pad 111 to the substrate 100. Furthermore, a pad 101, provided on the substrate 100, serves as a bonding member for connecting the substrate 100 to the semiconductor chip 110. The bump 112 provided on the chip is connected to the pad 101 provided on the substrate by thermocompression bonding or ultrasonic welding.

It is a recent trend that the semiconductor chip 110 is highly integrated and accordingly the size W1 of the pad 111 provided on the semiconductor chip 110 and a pitch P1 between two neighboring pads 111 are very small. The size of the bump 112 formed on the pad 111 is small, correspondingly. When the semiconductor chip 110 is flip chip bonded to the substrate 100 via the bump 112, it is necessary to adjust the size of the pad 101 formed on the substrate 100 so as to fit to the pitch P1 of the pad 111 provided on the semiconductor chip 110. Accordingly, the size of the pad 101 formed on the substrate 100 is small when the pitch between neighboring pads 111 provided on the semiconductor chip 110 is narrow.

The semiconductor chip 110 and the substrate 100 are bonded in the following manner.

First, by plating or with discharge, a ball is formed on the pad 111 provided on an active face of the semiconductor chip 110. Then, the ball is press welded to the pad 111 under given heat or ultrasonic wave so as to form the bump (i.e. projected electrode) 112 on the pad 111.

Then, the semiconductor chip 110 is mounted on the substrate 100 under a condition that semiconductor chip 110 is faced down. The bump 112 is mechanically and electrically bonded to the pad 101 provided on the substrate 100 under applied heat and pressure. Furthermore, for the purpose of enhancing the bonding reliability, a clearance between the semiconductor chip 110 and the substrate 100 is filled with an underfill member (e.g. a thermosetting epoxy resin) 120.

When the size Φ20 of the bump 112 is small, a gap G to be formed after accomplishing the bonding operation between the semiconductor chip 110 and the substrate 100 is small correspondingly. This results in reduction in a stress relaxing capability of the underfill member 120 which can relax a thermal stress if caused due to a thermal expansion coefficient difference between the substrate 100 and the semiconductor chip 100. Furthermore, a bonding area between the bump 112 and the pad 101 provided on the substrate is small, which results in deterioration in the bonding reliability against the above-described thermal stress.

From the foregoing reasons, this conventional bonding technique cannot be preferably applied to electronic control apparatuses installed in engine rooms or any other devices which are subjected to severe temperature environments.

SUMMARY OF THE INVENTION

In view of the above-described problems, the present invention has an object to provide a flip chip packaging structure that is capable of improving the bonding reliability between a semiconductor chip and a substrate. Furthermore, the present invention has an object to provide a related flip chip packaging method.

In order to accomplish the above and other related objects, the present invention provides a first flip chip packaging structure including a bump formed on a first bonding pad provided on a surface of a semiconductor chip and a second bonding pad provided on a substrate, wherein the first and second bonding pads are mutually connected by electrically and mechanically bonding the first and second bonding pads via the bump under a condition that the bump formed on the semiconductor chip is adjusted in position relative to the second bonding pad provided on the substrate, wherein a bump is formed on the second bonding pad provided on the substrate, at least two apertures are opened on a passivation film covering the first bonding pad provided on the semiconductor chip, bumps are formed in respective apertures, and the bump provided on the substrate advances and enters into a clearance between the bumps provided on the semiconductor chip.

According to this arrangement, the bump provided on the substrate advances and enters into the clearance between the bumps provided on the semiconductor chip. The bonding area becomes large. Furthermore, a formed bonding surface is not parallel to a shearing direction of a thermal stress to be produced due to a thermal expansion coefficient difference between the substrate and the semiconductor chip. Thus, it becomes possible to improve the bonding reliability between the semiconductor chip and the substrate.

According to the flip chip packaging structure in accordance with this invention, it is preferable that the bump formed on the semiconductor chip is a bump formed by plating. This is advantageous in that the shape of the bump can be formed accurately. Accordingly, the shape of a clearance can be formed accurately.

Preferably, the bump formed on the substrate is a stud bump formed by anchoring a gold ball formed with the discharge onto the second bonding pad provided on the substrate. The stud bumper is taller and softer than a plating bump and accordingly can deform plastically and easily advance and enter into the clearance between the bumps provided on the semiconductor chip.

Preferably, the semiconductor chip is faced down when it is mounted, and then heat and pressure are added to cause the bump formed on the substrate to plastically deform and then advance and enter into the clearance between the bumps formed on the semiconductor chip. Applying heat and pressure enables the bump formed on the substrate to surely cause plastic deformation and then advance and enter into the clearance between the bumps provided on the semiconductor chip.

Preferably, the semiconductor chip is faced down when it is mounted, and then heat, pressure, and ultrasonic vibration are added to cause the bump formed on the substrate to plastically deform and then advance and enter into the clearance between the bumps formed on the semiconductor chip. This is effective in reducing the heating temperature level and forming a strong and stable metallic bonding between the bump and a bump surface within a short bonding time.

Preferably, a space intervening between the semiconductor chip and the substrate is filled with an underfill member. The underfill member is, for example, an adhesive. The packaging according to this invention can leave a relatively large gap between the semiconductor chip and the substrate. Thus, it becomes possible to fill the intervening space with a sufficient amount of underfill member. Hence, it becomes possible to reduce a concentrated stress acting on a bump bonding portion when a relative displacement between the semiconductor chip and the substrate is caused due to their thermal expansion coefficient difference. In other words, the underfill member assures a sufficient stress relaxing capability, and thus the bonding reliability can be improved.

Preferably, the substrate is a circuit substrate. Alternatively, it is preferable that the substrate is an interposer substrate of a semiconductor package.

To accomplish the above-described and other related objects, the present invention provides a second flip chip packaging structure including a bump formed on a first bonding pad provided on a surface of a semiconductor chip and a second bonding pad provided on a substrate, wherein the first and second bonding pads are mutually connected by electrically and mechanically bonding the first and second bonding pads via the bump under a condition that the bump formed on the semiconductor chip is adjusted in position relative to the second bonding pad provided on the substrate, wherein the second bonding pad provided on the substrate has a through hole or a recess, and the second bonding pad is bonded to the bump via an inner surface of the through hole or the recess.

According to this arrangement, the bonding pad provided on the substrate has an increased bonding area. Furthermore, at least part of a formed bonding surface is not parallel to a shearing direction of a thermal stress to be produced due to thermal expansion coefficient difference between the substrate and the semiconductor chip. Thus, it becomes possible to improve the bonding reliability between the semiconductor chip and the substrate.

According to this flip chip packaging structure, it is preferable that the substrate is an interposer substrate of a semiconductor package. In this case, it is preferable that lands are disposed on one surface of the interposer substrate and electro-conductive balls are formed on the lands to bond respective lands to corresponding lands of an associated circuit substrate so as to constitute a ball grid array. Furthermore, it is preferable that the substrate is a circuit substrate.

Furthermore, it is preferable that the through hole or the recess is formed by etching. This is advantageous in accurately positioning and simply forming the through hole or recess without substantially changing the manufacturing processes of the substrate which are generally used.

Preferably, the bonding pad having the through hole or the recess is formed by plating. This is advantageous in that general manufacturing processes for forming a substrate can be used and it becomes possible to obtain a bonding pad whose upper surface is flat and stable in area. Obtaining a stable bonding area is feasible.

Preferably, the through hole or the recess is formed by a cutting operation using a drill or by a pressing operation using a die. This is advantageous in accurately controlling the shape of the through hole or the recess.

Preferably, the through hole or the recess is formed by a trimming operation using irradiation of a laser beam. This is advantageous in accurately controlling the shape of the through hole or the recess.

Preferably, the through hole or the recess has a notched shape opened to an end surface of the bonding pad provided on the substrate. According to this arrangement, a vacant space in the through hole is not hermetically closed when such a space is left at the bottom of the through hole or the recess after accomplishing a bonding operation. In other words, the bonding reliability is not lessened due to expansion or contraction of a closed space occurring when the temperature changes.

Preferably, a plurality of through holes or recesses are provided. This is advantageous in that the bonding area can be enlarged.

Furthermore, it is preferable that the bump is a stud bump formed by anchoring a gold ball formed with the discharge onto the first bonding pad provided on the semiconductor chip. The stud bump is tall and soft, and accordingly can deform largely. Hence, through the flip chip bonding operation, the bump surely causes plastic deformation and easily bonds together with the through hole or recess of the bonding pad.

Preferably, the second bonding pad provided on the substrate and the bump provided on the semiconductor chip are thermocompression bonded to each other under applied heat and pressure. Applying heat and pressure enables the bump to cause a plastic deformation so that the bump can extend in the through hole or recess so as to increase the metallic bonding surface.

Preferably, the bonding pad provided on the substrate and the bump provided on the semiconductor chip are bonded to each other under applied heat, pressure, and ultrasonic vibration. Additionally using the ultrasonic vibration is effective in reducing the time required for a bonding operation. Furthermore, it becomes possible to realize a low-temperature bonding operation performed under relatively low heat temperatures.

Preferably, the bonding pad provided on the substrate and the bump provided on the semiconductor chip are bonded via an anisotropic conductive material. Electro-conductive particles contained in the anisotropic conductive material are easily trapped by the interface between the bump and the through hole or recess. Thus, it becomes possible to obtain an adequate and stable bonding resistance.

Preferably, the bonding pad provided on the substrate and the bump provided on the semiconductor chip are bonded via an electro-conductive material. The bonding area of the bonding pad increases when the conductive material advances and enters into the through hole or recess. The bonding reliability can be improved.

Furthermore, to accomplish the above and other related objects, the present invention provides a first method for forming a flip chip packaging structure comprising a step of providing at least two apertures on a passivation film covering a first bonding pad provided on a semiconductor chip, a step of forming first bumps in respective apertures, a step of forming a second bump on a second bonding pad provided on a substrate, a step of adjusting the position of the first bumps formed on the semiconductor chip relative to the second bump provided on the substrate, and a step of electrically and mechanically bonding the first and second bonding pads via the first and second bumps by causing the second bump provided on the second substrate to plastically deform and then enter into a clearance between the first bumps provided on the semiconductor chip.

Preferably, the step of forming the first bumps on the semiconductor chip is performed by plating.

Preferably, the second bump formed on the substrate is a stud bump formed by anchoring a gold ball formed with the discharge onto the second bonding pad provided on the substrate.

Preferably, the first flip chip packaging method further includes a step of mounting the semiconductor chip face-down when it is packaged with the substrate, and a step of applying heat and pressure (and ultrasonic vibration) to cause the second bump formed on the substrate to plastically deform and then enter into the clearance between the first bumps formed on the semiconductor chip.

Preferably, the first flip chip packaging method further includes a step of filling a space intervening between the semiconductor chip and the substrate with an underfill member.

Preferably, the substrate is a circuit substrate, or an interposer substrate of a semiconductor package.

Furthermore, the present invention provides a second method for forming a flip chip packaging structure comprising a step of forming a bump on a first bonding pad provided on a surface of a semiconductor chip, a step of forming a second bonding pad on a substrate, the second bonding pad having a through hole or a recess, a step of adjusting the position of the bump formed on the semiconductor chip relative to the second bonding pad provided on the substrate, and a step of electrically and mechanically bonding the first and second bonding pads via the bump by causing the bump to plastically deform and then enter into the through hole or the recess of the second bonding pad on a substrate.

Preferably, the substrate is an interposer substrate of a semiconductor package.

Preferably, lands are disposed on one surface of the interposer substrate, and electro-conductive balls are formed on the lands to bond respective lands to corresponding lands of an associated circuit substrate so as to constitute a ball grid array.

Preferably, the substrate is a circuit substrate.

Preferably, the step of forming the second bonding pad having the through hole or the recess is performed by etching or plating, or by a cutting operation using a drill or by a pressing operation using a die, or by a trimming operation using irradiation of a laser beam.

Preferably, the through hole or the recess has a notched shape opened to an end surface of the bonding pad provided on the substrate.

Preferably, a plurality of through holes or recesses are provided.

Preferably, the bump is a stud bump formed by anchoring a gold ball formed with the discharge onto the first bonding pad provided on the semiconductor chip.

Preferably, the step of bonding the second bonding pad provided on the substrate and the bump provided on the semiconductor chip is performed by thermocompression bonding under applied heat and pressure (and ultrasonic vibration).

Preferably, the step of bonding the bonding pad provided on the substrate and the bump provided on the semiconductor chip is performed by using an anisotropic conductive material or by using an electro-conductive material.

BRIEF DESCRIPTION OF THE DRAWINGS

The above and other objects, features and advantages of the present invention will become more apparent from the following detailed description which is to be read in conjunction with the accompanying drawings, in which:

FIG. 13 is a vertical cross-sectional view showing a pre-assembled condition of components to be flip chip packaged in accordance with the second embodiment of the present invention;

FIG. 14A is a plan view showing another substrate in accordance with the second embodiment of the present invention;

FIG. 14B is a cross-sectional view showing the substrate in accordance with the second embodiment of the present invention, taken along a line 14B—14B of FIG. 14A;

DESCRIPTION OF THE PREFERRED EMBODIMENTS

Preferred embodiments of the present invention will be explained hereinafter with reference to attached drawings.

First Embodiment

Hereinafter, a first embodiment of the present invention will be explained with reference to attached drawings.

Figure 1:
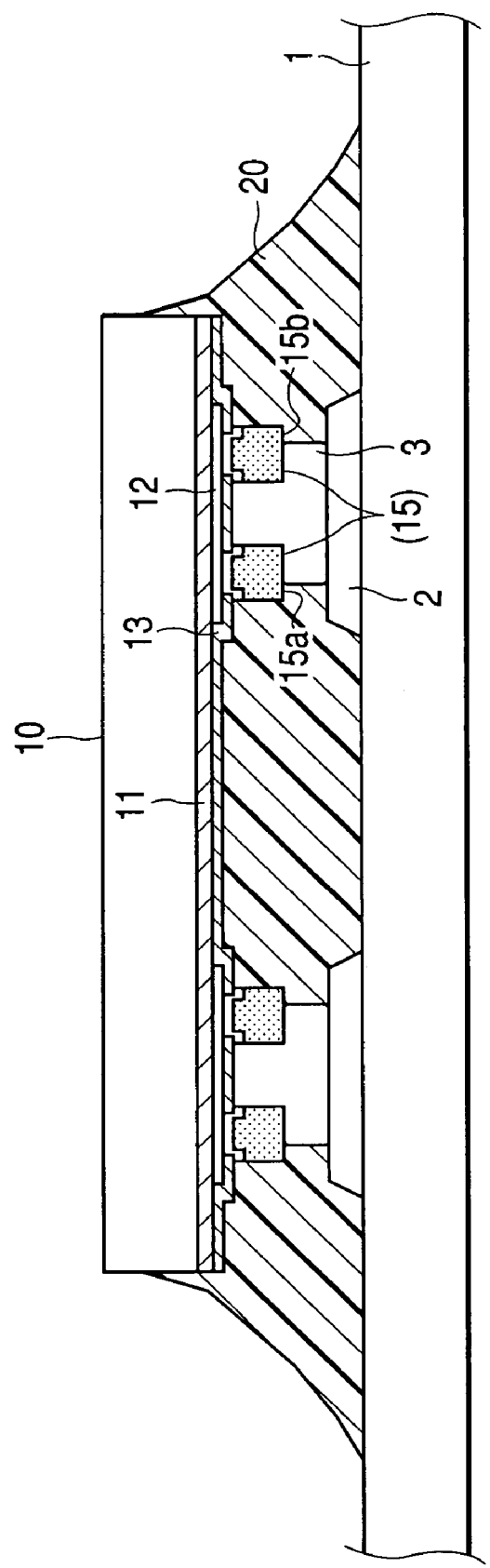
FIG. 1 is a vertical cross-sectional view showing a semiconductor device in accordance with a first embodiment of the present invention.
Figure 2:
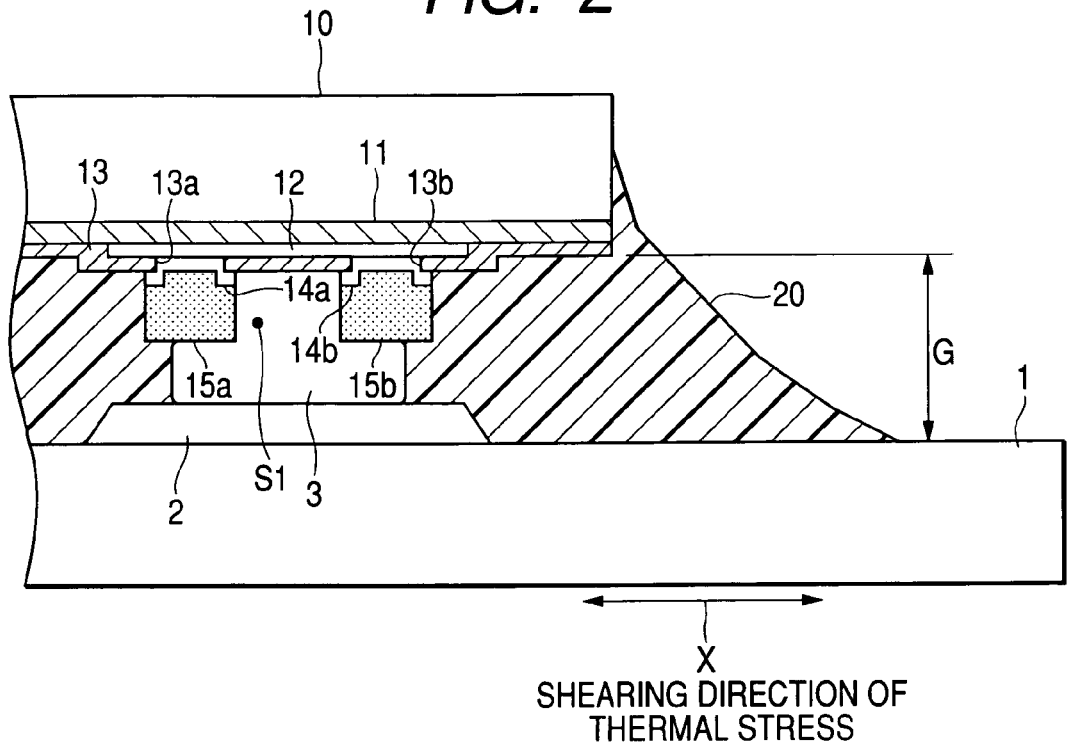
FIG. 2 is a vertical cross-sectional view showing a flip chip packaged portion in accordance with the first embodiment of the present invention.
Figure 3:
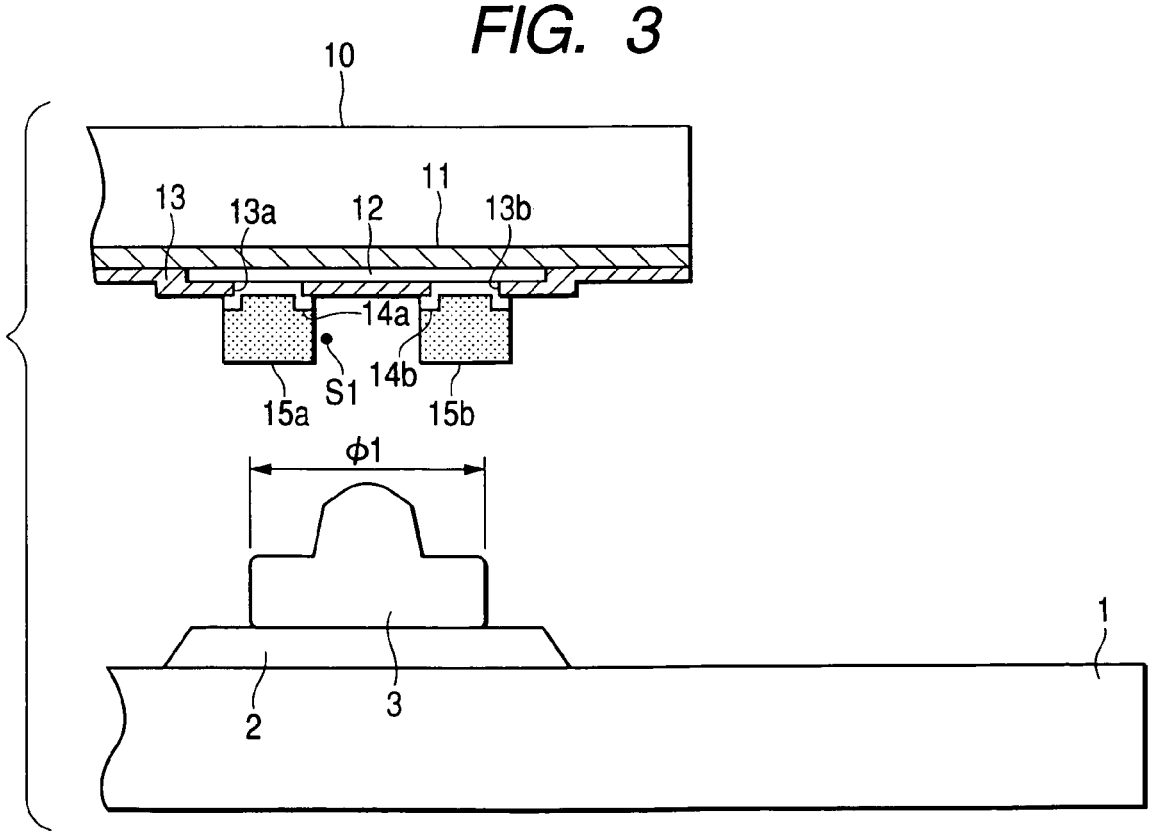
FIG. 3 is a vertical cross-sectional view showing a pre-assembled condition of components to be flip chip packaged in accordance with the first embodiment of the present invention.

FIG. 1 is a vertical cross-sectional view showing a semiconductor device in accordance with the first embodiment of the present invention. A semiconductor chip 10 is flip chip packaged on a circuit substrate 1. More specifically, under a condition that a bump 15 provided on the semiconductor chip 10 is adjusted in position relative to a bonding pad 2 provided on the circuit substrate 1, a bonding pad 12 provided on the semiconductor chip and the bonding pad 2 provided on the substrate are electrically and mechanically bonded to each other via the bump 15. FIG. 2 is a vertical cross-sectional view showing a flip chip packaged portion. FIG. 3 shows a pre-assembled condition of the circuit substrate 1 and the semiconductor chip 10. FIG. 4 shows the circuit substrate 1 which is not packaged yet. Furthermore, FIG. 5 shows only the semiconductor chip 10. The semiconductor device of this embodiment is incorporated in an automotive electronic control apparatus which is usually installed in an engine room, and is accordingly subjected to severe temperature environment.

In FIG. 5, an insulation film 11 is formed in an upper surface of the semiconductor chip 10. A bonding pad 12 is formed on an insulation film 11. The bonding pad 12 has substantially a square shape. A passivation film 13, formed on the insulation film 11, covers the pad 12. More specifically, the passivation film 13 is formed as an outer surface of the semiconductor chip 10. The passivation film 13 covering the bonding pad 12 of the semiconductor chip 10 has two apertures 13a and 13b which are provided with barrier metals 14a and 14b. Two bumps 15a and 15b are formed on the barrier metals 14a and 14b, respectively. Namely, the bumps 15a and 15b are formed via barrier metal 14a and 14b on the bonding pad 12 provided on the surface of semiconductor chip 10. Each of the apertures 13a and 13b is rectangular and extends in the same direction. In other words, the apertures 13a and 13b are parallel to each other. Accordingly, each of the bumps 15a and 15b is rectangular. These bumps 15a and 15b are disposed in parallel to each other. A clearance S1 is provided between the bumps 15a and 15b. The center of clearance S1 agrees with the center of the pad 12 provided on the semiconductor chip 10.

The passivation film 13 is a silicon dioxide film (i.e. $SiO_2$) or a silicon nitride film (i.e. SiN). The barrier metals 14a and 14b are nickel (i.e. Ni). The bumps 15a and 15b are gold (i.e. Au).

On the other hand, as shown in FIG. 4, the bonding pad 2 is formed on the circuit substrate 1. A bump 3 is formed on bonding pad 2 provided on the substrate. The bump 3 is a stud bump which is formed by press welding (anchoring) a gold ball formed with the discharge onto the bonding pad 2.

As shown in FIGS. 1 and 2, a space intervening between the semiconductor chip 10 and the circuit substrate 1 is filled with an underfill member (or an underfill adhesive) 20 which is for example made of an epoxy or other thermosetting resin.

Figure 6:
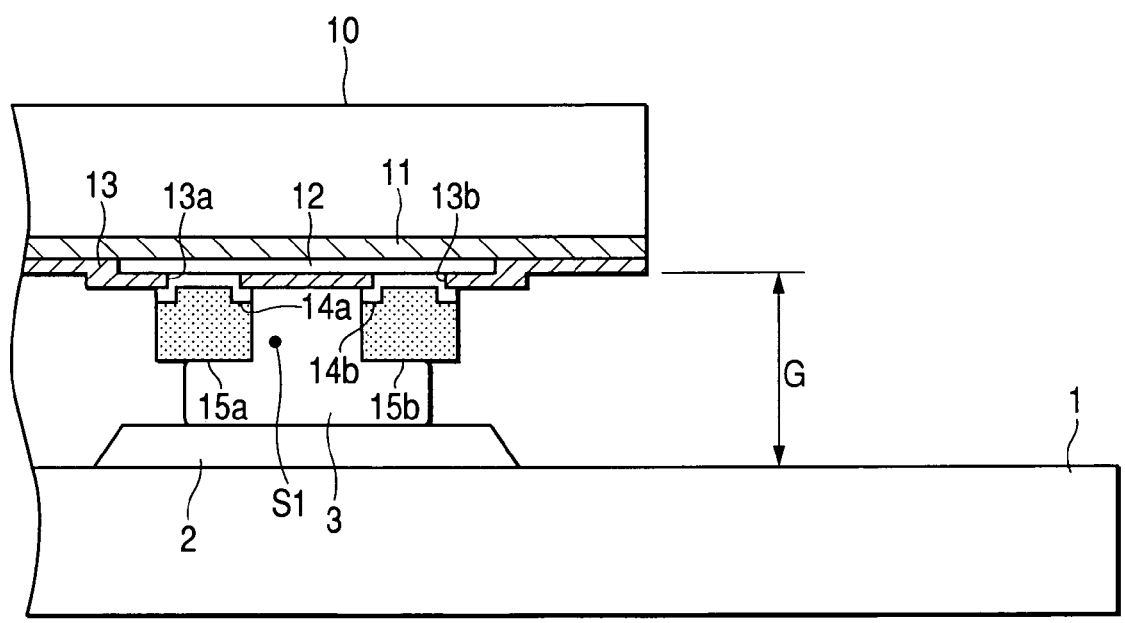
FIG. 6 is a vertical cross-sectional view showing the condition of the flip chip packaged portion immediately after the bonding operation is accomplished in accordance with the first embodiment of the present invention.

First of all, in a practical packaging operation, the bump 3 provided on the substrate 1 is adjusted in position relative to the bumps 15a and 15b provided on the semiconductor chip as shown in FIG. 3. From this condition, the bump 3 provided on the substrate plastically deforms under applied heat and pressure. The deformed bump 3 provided on the substrate 1 thus advances and enters into the clearance S1 between the bumps 15a and 15b provided on the semiconductor chip as shown in FIG. 6. More specifically, in bonding the bumps 15a and 15b provided on the semiconductor chip 10 with the bump 3 provided on the substrate 1, the semiconductor chip 10 is first faced down against the substrate 1. Then, the applied heat and pressure cause plastic deformation of the bump 3 provided on the substrate. And, the deformed bump 3 enters into the clearance S1 between the bumps 15a and 15b provided on the semiconductor chip 10, thereby accomplishing the bonding operation between the semiconductor chip and the circuit substrate. Applying heat and pressure is effective in surely or forcibly causing the bump 3 to plastically deform and enter into the clearance S1.

Thereafter, as shown in FIGS. 1 and 2, the space intervening between the semiconductor chip 10 and the circuit substrate 1 is filled with the underfill member 20.

As shown in FIG. 2, the three-dimensional bonding surface being thus obtained has an increased bonding area and includes a bonding surface not parallel to a shearing direction X of the thermal stress to be produced due to a thermal expansion coefficient difference between the circuit substrate 1 and the semiconductor chip 10. Furthermore, compared with a case that no bump is provided on the substrate and the chip 10 has the bumps 15a and 15b, it is possible to enlarge the gap (distance) between the semiconductor chip 10 and the substrate 1 (refer to FIG. 19). In other words, the stress relaxing capability of the underfill member 20 can be enhanced. The bonding reliability can be improved remarkably.

Namely, in the structure for flip chip bonding the faced-down semiconductor chip 10 on the substrate 1, the bump 3 is formed on the pad 2 of the substrate 1 as a bonding member to be faced toward the semiconductor chip 10. Furthermore, at least two bumps (15a, 15b) are formed on one pad 12 provided on the active face of the semiconductor chip 10 as bonding members to be faced toward the substrate 1. According to this arrangement, a large gap G is provided between the semiconductor chip 10 and the substrate 1 after the bonding operation is accomplished. Furthermore, a large bonding area is provided. Furthermore, it is possible to form a bonding surface which is not parallel to the shearing direction X of the thermal stress to be produced due to a thermal expansion coefficient difference between the substrate 1 and the semiconductor chip 10. Thus, the bonding reliability can be remarkably improved.

Figure 5A:
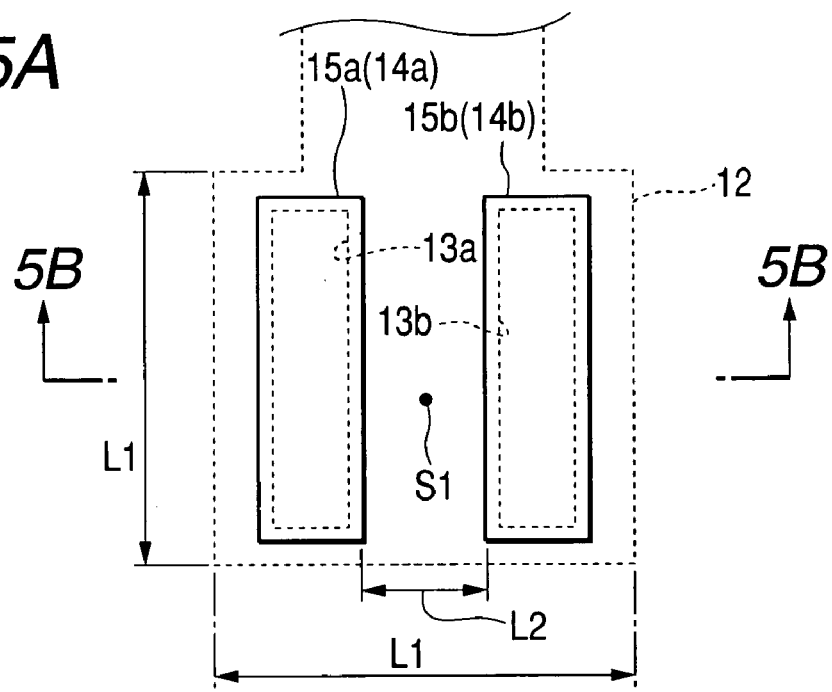
FIG. 5A is a plan view showing a semiconductor chip in accordance with the first embodiment of the present invention.
Figure 5B:
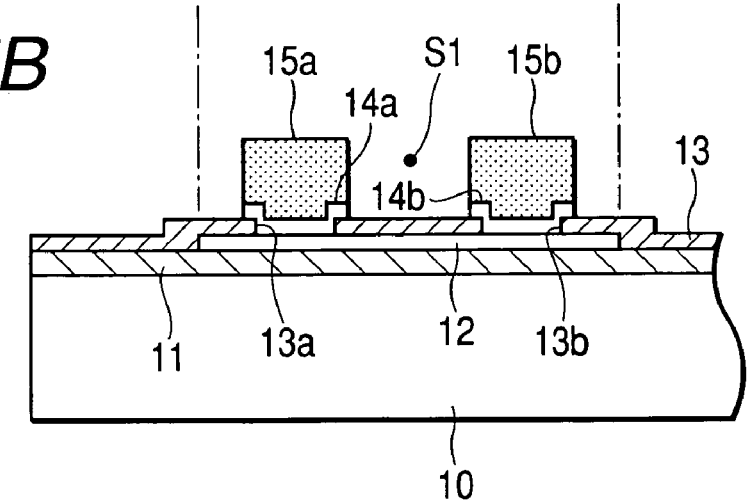
FIG. 5B is a cross-sectional view showing the semiconductor chip in accordance with the first embodiment of the present invention, taken along a line 5B—5B of FIG. 5A.

In the arrangement shown in FIGS. 5A and 5B, the bumps 15a and 15b provided on the semiconductor chip 10 can be formed by plating. This is advantageous in that the formed bumps are accurate in shape. Accordingly, the formed clearance S1 is accurate. The optimum size of clearance S1 (i.e. gap L2 between two bumps) is in the range from 20% to 40% of one side L1 of the square pad 12 provided on the semiconductor chip 10 or in the range from 15 µm to 30 µm. This optimized size is determined considering such conditions that the bonding area of the upper surface of respective bumps 15a and 15b can be enlarged and the bump 3 provided on the substrate can easily and surely enter into the clearance S1.

Figure 4A:
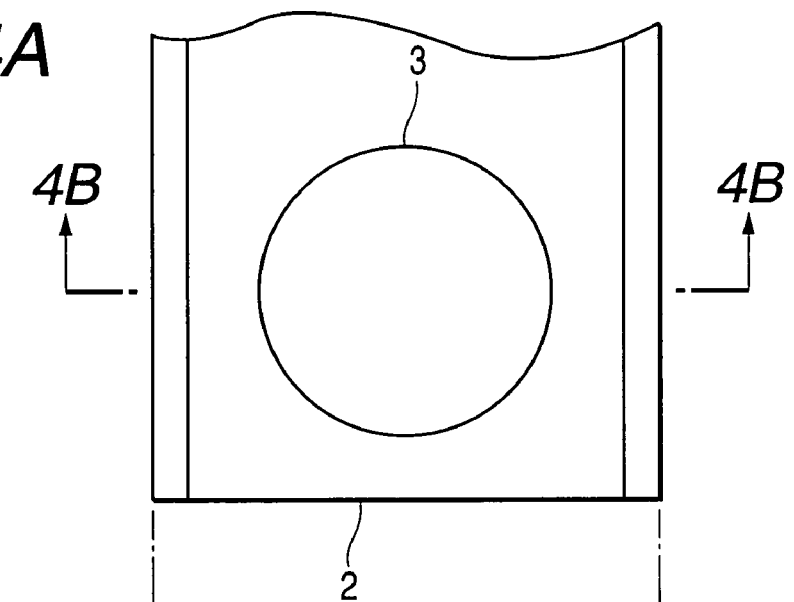
FIG. 4A is a plan view showing a circuit substrate in accordance with the first embodiment of the present invention.
Figure 4B:
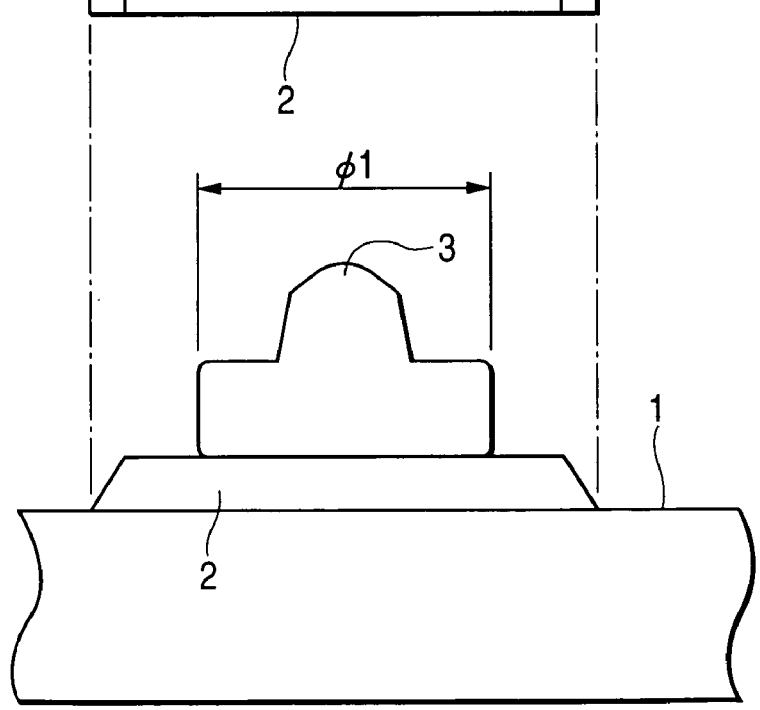
FIG. 4B is a cross-sectional view showing the circuit substrate in accordance with the first embodiment of the present invention, taken along a line 4B—4B of FIG. 4A.

On the other hand, according to the arrangement shown in FIGS. 4A and 4B, the bump 3 provided on the substrate 1 is a stud bump which is formed by press welding (anchoring) a gold ball formed with the discharge onto the pad 2 provided on the substrate under given heat or ultrasonic wave. The bump 3 can plastically deform and easily enter into the clearance S1 between the bumps 15a and 15b provided on the semiconductor chip 10, because the stud bump is tall and soft compared with a plating bump.

As described above, this embodiment forms the bump 3 on the bonding pad 2 provided on the substrate and opens at least two apertures 13a and 13b on the passivation film 13 covering the bonding pad 12 provided on the semiconductor chip 10, and further forms the bumps 15a and 15b in respective apertures 13a and 13b. Then, this embodiment causes the bump 3 provided on the substrate 1 to advance and enter into the clearance S1 between the bumps 15a and 15b provided on the semiconductor chip.

In this manner, the bump 3 provided on the substrate enters into the clearance S1 between the bumps 15a and 15b provided on the semiconductor chip. This embodiment provides a three-dimensional bonding surface having a large bonding area. Furthermore, the embodiment can form a bonding surface not parallel to the shearing direction X of the thermal stress to be produced due to a thermal expansion coefficient difference between the substrate 1 and the semiconductor chip 10. The bonding reliability between the semiconductor chip and the substrate can be remarkably improved.

Furthermore, as shown in FIGS. 2 and 6, this embodiment can provide a large gap G between the semiconductor chip 10 and the substrate 1 after the packaging operation is accomplished. Therefore, the space intervening between the circuit substrate 1 and the semiconductor chip 10 is filled with a sufficient amount of underfill member 20. Thus, this embodiment can reduce a concentrated stress acting on a bump bonding portion when a relative displacement between the semiconductor chip 10 and the substrate 1 is caused due to their thermal expansion coefficient difference. In other words, the underfill member 20 is thick enough to assure a sufficient stress relaxing capability, and thus the bonding reliability can be improved.

According to the arrangement shown in FIG. 6, this embodiment applies heat and pressure to facilitate the bonding between the bump 3 provided on the substrate 1 and the bumps 15a and 15b provided on the semiconductor chip 10. The bump 3 provided on the substrate 1 causes plastic deformation sufficiently and smoothly advance and enter into the clearance S1 between the bumps 15a and 15b provided on the semiconductor chip 10. However, this embodiment can use an alternative method. For example, after the faced down semiconductor chip 10 is mounted on the substrate, it is possible to apply ultrasonic vibration to the semiconductor chip 10 in addition to heat and pressure to cause the bump 3 provided on the substrate to deform plastically and then advance and enter into the clearance S1 between the bumps 15a and 15b provided on the semiconductor chip. This is advantageous in lowering the heating temperature level. A strong and stable metallic bonding is formed along the surface between the bump 3 and respective bumps 15a and 15b within a relatively short bonding time.

A preferable temperature range for the thermocompression bonding is in the range from 200° C. to 300° C. A preferable temperature range for the ultrasonic bonding is in the range from 100° C. to 200° C. In general, the damage added to the semiconductor chip 10 decreases when a lowering heating temperature is used during the bonding process. For example, it is now assumed that the pad 12 provided on the semiconductor chip 10 has the size of 100 µm in vertical and lateral directions (refer to L1 shown in FIGS. 5A and 5B) and the bump (i.e. stud bump) 3 formed on the pad 2 provided on the substrate 1 has the diameter of 90 µm (refer to $\Phi 1$ shown in FIGS. 4A and 4B). In this case, the pressure applied during the ultrasonic bonding is in the range from 40 gf to 80 gf per bump provided on the substrate. The frequency of the ultrasonic wave is in the range from 40 kHz to 60 kHz. The amplitude of the ultrasonic wave is in the range from 1 µm to 5 µm. The oscillation time of the ultrasonic wave is in the range from 400 ms to 1000 ms.

Figure 7A:
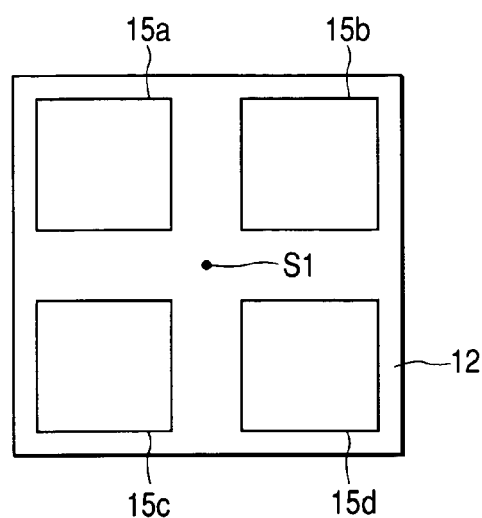
FIGS. 7A to 7D are plan views respectively showing a bump arrangement formed on the semiconductor chip in accordance with the first embodiment of the present invention.
Figure 7B:
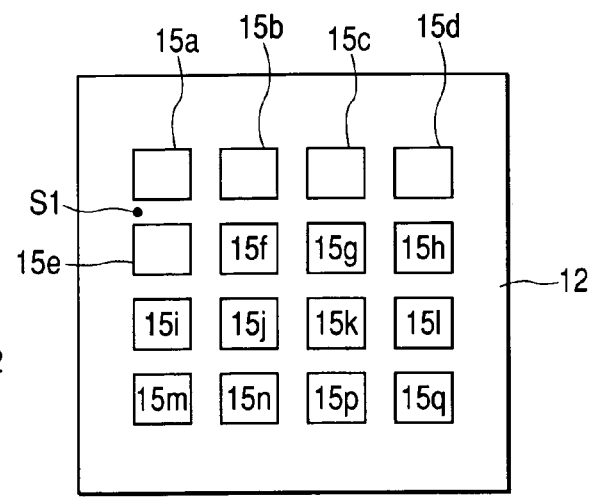
Figure 7C:
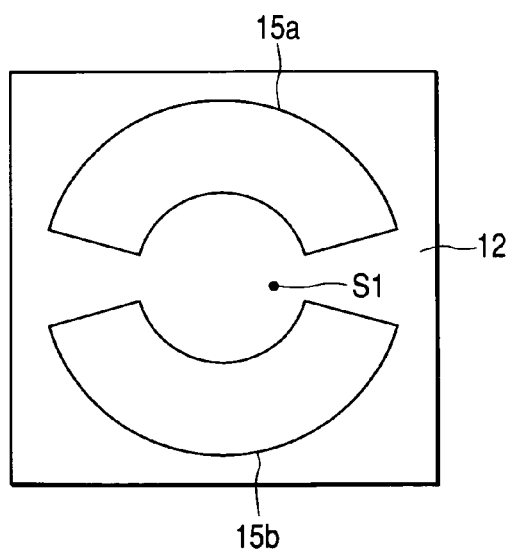
Figure 7D:
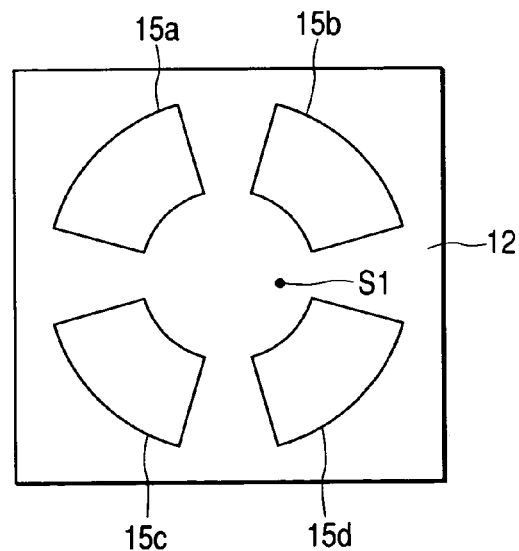

According to the arrangement shown in FIGS. 5A and 5B, only two rectangular apertures 13a and 13b and corresponding two bumps 15a and 15b are provided. However, it is possible to adopt other arrangements shown in FIGS. 7A to 7D. The arrangement shown in FIG. 7A shows four square bumps 15a to 15d. The arrangement shown in FIG. 7B shows sixteen square bumps 15a to 15q arranged in vertical and lateral directions. The arrangement shown in FIG. 7C shows two bumps 15a and 15b each having a half annular ring shape. The arrangement shown in FIG. 7D shows four bump 15a to 15d each having a quarter annular ring shape.

Figure 8:
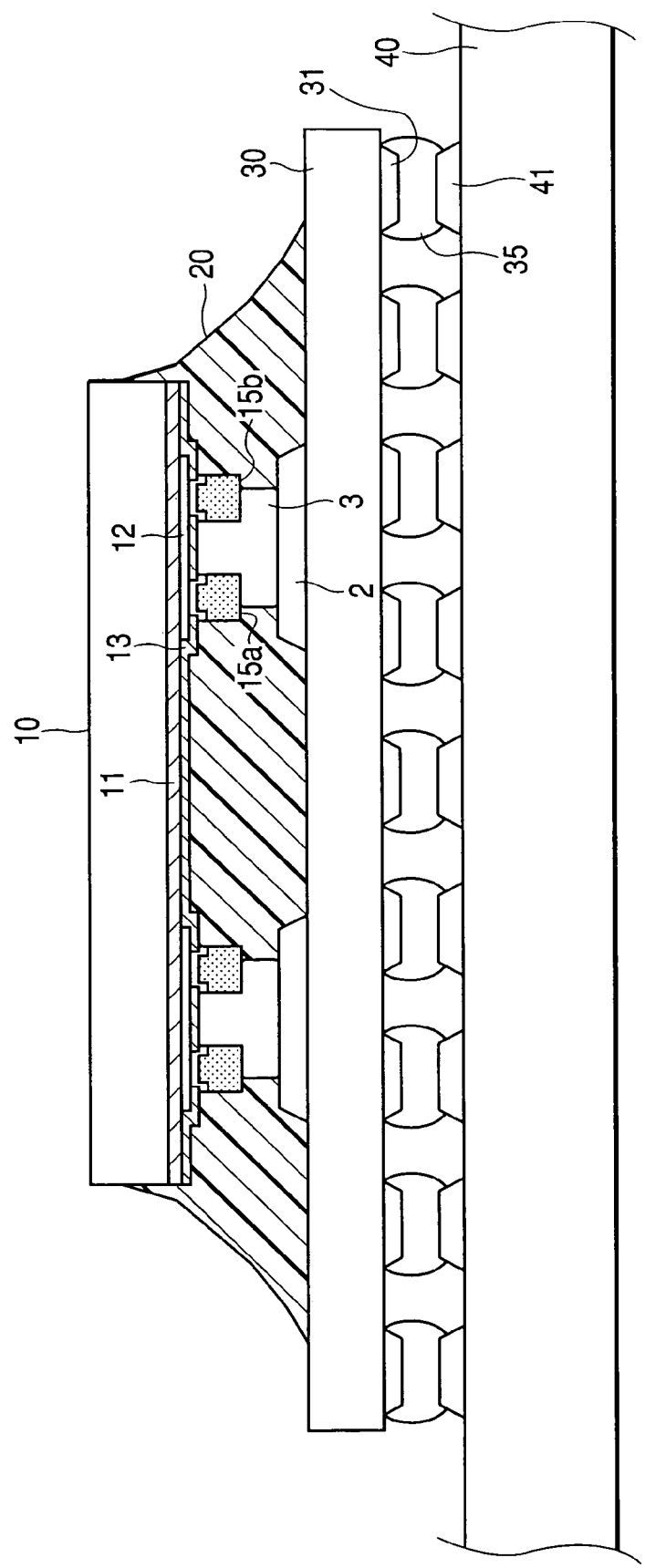
FIG. 8 is a vertical cross-sectional view showing a modified semiconductor device in accordance with the first embodiment of the present invention.

According to the arrangement shown in FIG. 1, the semiconductor chip 10 is directly mounted on the circuit substrate 1 without being packaged beforehand. However, as an alternative arrangement, it is preferable to use an interposer substrate 30 of a semiconductor package as shown in FIG. 8. According to the arrangement shown in FIG. 8, the interposer substrate 30 has one surface (i.e. upper surface) on which the semiconductor chip 10 is mounted and the opposite surface (i.e. lower surface) on which numerous lands 31 are formed as bonding members to be faced toward a circuit substrate 40. Similarly, numerous lands 41 are formed on the circuit substrate 40 as bonding members to be faced toward the semiconductor package. The lands 31 of the interposer substrate 30 and the lands 41 of the circuit substrate 40 are mechanically and electrically bonded by using a solder or any other electro-conductive paste 35. Alternatively, it is preferable that a solder ball is mounted beforehand on each land 31 on the interposer substrate 30.

Second Embodiment

Next, a second embodiment of the present invention will be explained.

Figure 9:
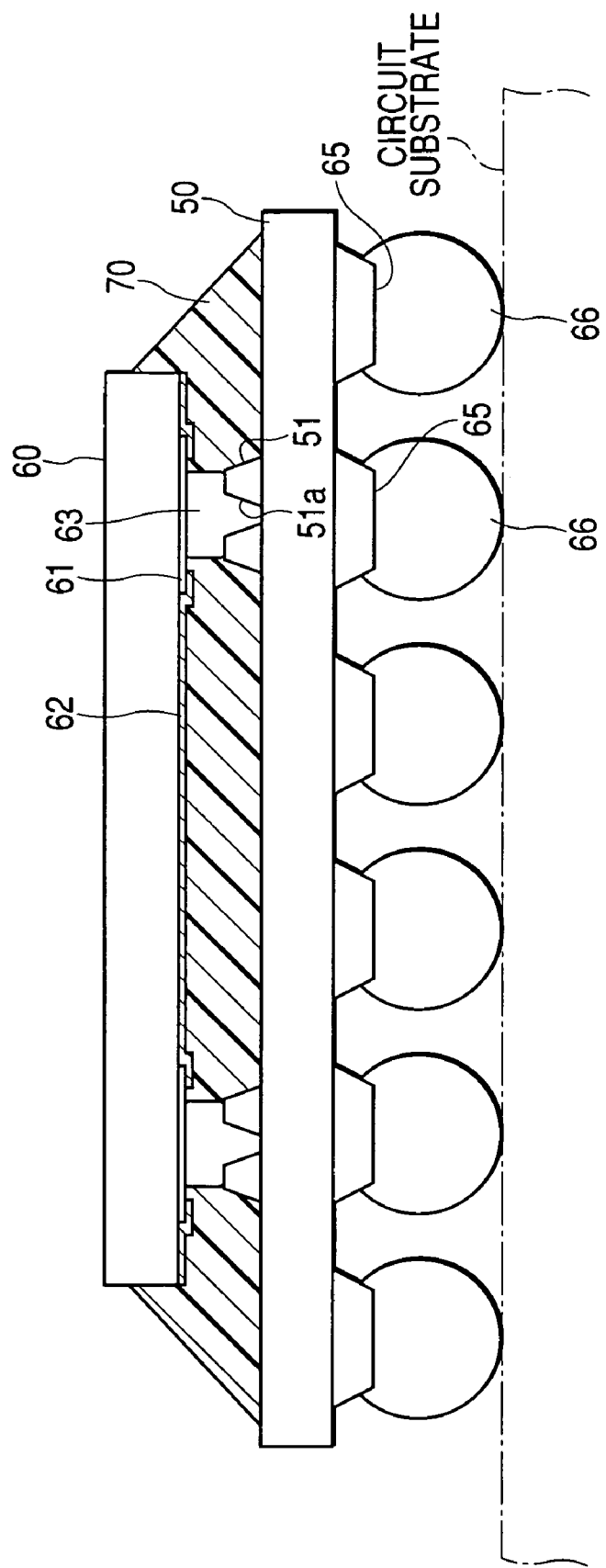
FIG. 9 is a vertical cross-sectional view showing a semiconductor 30 device in accordance with a second embodiment of the present invention.
Figure 10:
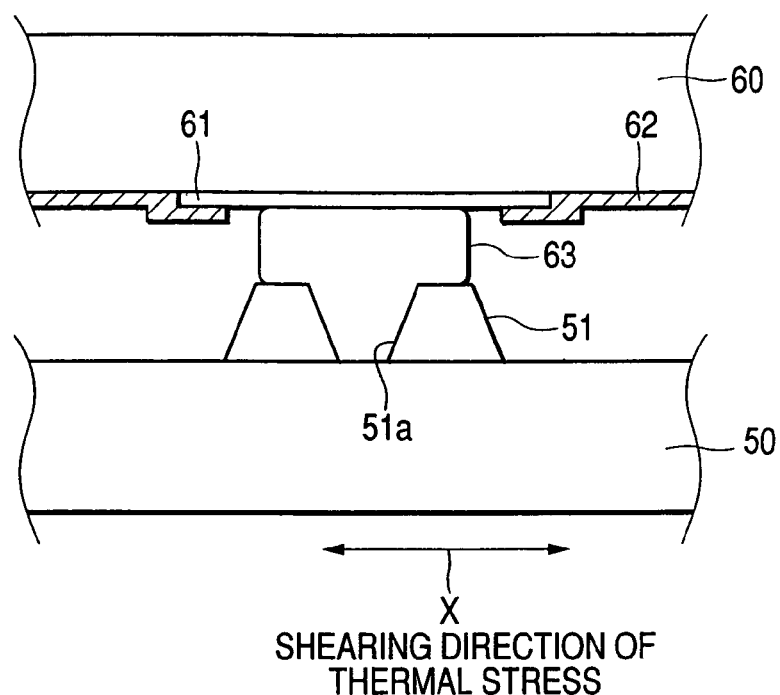
FIG. 10 is a vertical cross-sectional view showing a flip chip packaged portion in accordance with the second embodiment of the present invention.
Figure 11A:
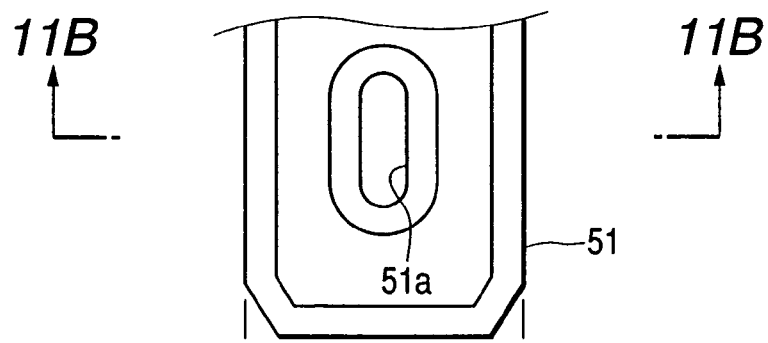
FIG. 11A is a plan view showing a substrate in accordance with the second embodiment of the present invention.
Figure 11B:
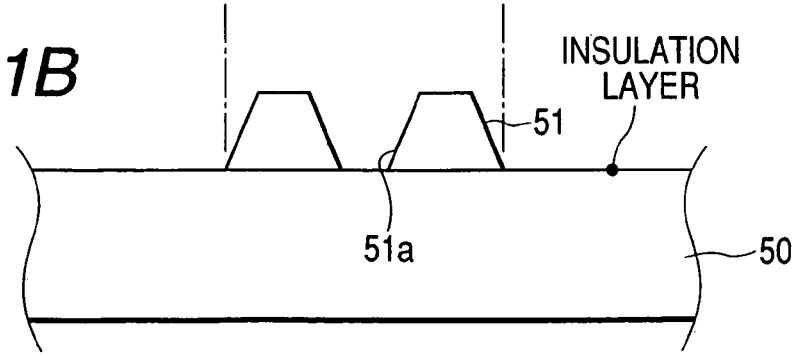
FIG. 11B is a cross-sectional view showing the substrate in accordance with the second embodiment of the present invention, taken along a line 11B—11B of FIG. 11A.

FIG. 9 is a vertical cross-sectional view showing a semiconductor device in accordance with the second embodiment of the present invention, according to which a semiconductor chip 60 is flip chip packaged on an interposer substrate 50. More specifically, under a condition that a bump 63 provided on the semiconductor chip 60 is adjusted in position relative to a bonding pad 51 provided on the substrate 50, a bonding pad 61 provided on the semiconductor chip 60 and the bonding pad 51 provided on the substrate 50 are electrically and mechanically bonded to each other via the bump 63. FIG. 10 is a vertical cross-sectional view showing a flip chip packaged portion. FIGS. 11A and 11B show only the semiconductor chip 50. The semiconductor device of this embodiment is incorporated in an automotive electronic control apparatus which is usually installed in an engine room, and is accordingly subjected to an environment with severe temperatures.

According to the arrangement shown in FIG. 9, the substrate 50 is an interposer substrate of a semiconductor package which has a lower surface (i.e. the opposite surface) on which numerous lands 65 are disposed so as to constitute a grid array as bonding members facing outward. A solder or comparative electro-conductive ball 66 is disposed on each land 65 (i.e. land grid array) disposed on a circuit substrate bonding surface of this interposer substrate 50. These electro-conductive balls 66 constitute a ball grid array. Each electro-conductive ball 66 is a bonding member faced toward an associated circuit substrate and to be bonded to a corresponding land formed on the associated circuit substrate. Furthermore, the upper surface of the interposer substrate 50 is a semiconductor chip mounting surface on which substrate bonding pads (i.e. electrodes provided on the substrate) 51 are formed. The semiconductor chip 60 is faced down when it is mounted. On the other hand, chip bonding pads (i.e. electrodes provided on the chip) 61 are formed on a surface (i.e. lower surface) of semiconductor chip 60 so as to agree in position with the corresponding pads 51 as shown in FIG. 10. A passivation film 62 is formed so as to cover respective pads 61. The passivation film 62 covering the pads 61 has apertures where the bumps 63 are formed on the pad 61.

Figure 12A:
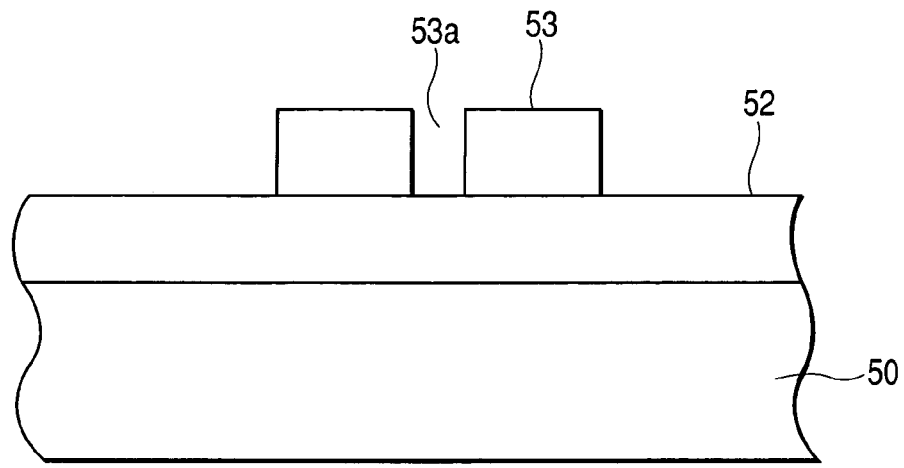
FIGS. 12A to 12C are views explaining the processes for forming a substrate bonding pad in accordance with the second embodiment of the present invention.
Figure 12B:
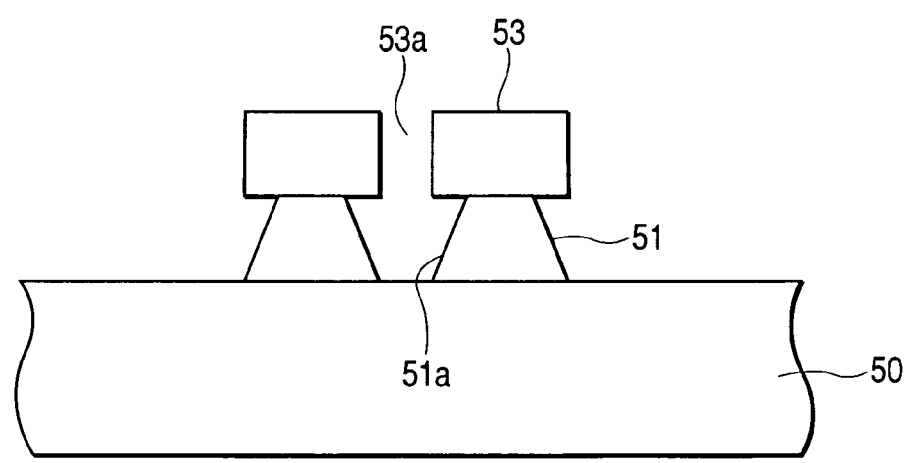
Figure 12C:
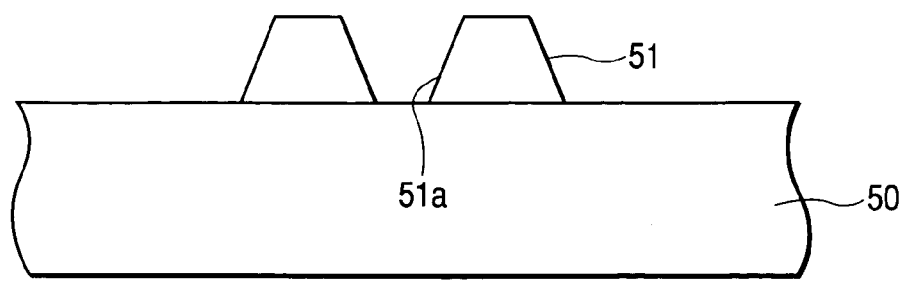

Furthermore, as shown in FIGS. 11A and 11B, the bonding pad 51 provided on the substrate has a through hole 51a. According to the arrangement shown in FIGS. 11A and 11B, the through hole 51a has an elongated shape. It is however preferable that the shape of the through hole 51a is circular or elliptic. The through hole 51a is formed in the following manner. First of all, as shown in FIG. 12A, a metal film 52 is formed on the substrate 50. A resist (i.e. mask) 53, formed by patterning, is disposed on the metal film 52. In this condition, the resist 53 has a through hole forming aperture 53a. Then, as shown in FIG. 12B, the pad 51 (more specifically, the wiring pattern) is formed by etching the metal film 52 with the resist 53 disposed thereon. As a result of this etching operation, the through hole 51a is formed in the bonding pad 51 because of the presence of the through hole forming aperture 53a extending vertically across the resist 53. The formed through hole 51a has an inclined (tapered) sidewall. Finally, as shown in FIG. 12C, the resist (i.e. mask) 53 is removed. As a result, the through hole 51a extending vertically in the bonding pad 51 is left on the substrate.

Next, the packaging operation is performed in the following manner. As shown in FIG. 13, a first process is adjusting the mutual position between the bonding pad 51 provided on the substrate and the bump 63 provided on the semiconductor chip. In this condition, as shown in FIG. 10, a process of deforming the bump 63 is performed to cause the bump 63 advance and enter into the through hole 51a of the bonding pad 51 provided on the substrate. As the flip chip bonding method, this embodiment uses a method of thermocompression bonding the bonding pad 51 and the bump 63 under applied heat and pressure.

According to the arrangement shown in FIG. 13, in the process of flip chip packaging the bonding pad 51 formed on interposer substrate 50 with the semiconductor chip 60 mounting the bump 63 formed on its active face, the center of the through hole 51a formed in the bonding pad 51 is located so as to agree with a bonding point (i.e. the center) of the bump 63. The diameter $\Phi 11$ of the through hole 51a is smaller than the maximum diameter $\Phi 10$ of the bump 63. According to this arrangement, the bonding surface between the bonding pad 51 and the bump 63 extends along an inclined surface of the side wall of the through hole 51a. The bonding area between the bonding pad 51 and the bump 63 is large. Furthermore, according to the arrangement shown in FIG. 10, it is possible to form a bonding surface not parallel to the shearing direction X of a thermal stress to be produced due to a thermal expansion coefficient difference between the interposer substrate 5 and the semiconductor chip 60. The bonding reliability can be remarkably improved.

The etching operation makes it possible to form the through hole 51a together with the wiring pattern as shown in FIGS. 12A to 12C. It is not necessary to change or modify the manufacturing processes for a general interposer substrate. It is possible to accurately and simply form the through hole 51a. In this etching operation, as described previously, positioning of the through hole 51a is carried out so that the center of the through hole 51a agrees with the bonding point of the bump 63. The through hole 51a has the diameter $\Phi 11$ that is smaller than the maximum diameter $\Phi 10$ of the bump 63 as shown in FIG. 13. During the flip chip bonding operation, the bump 63 plastically deforms and the inside space of the through hole 51a is filled with the deformed bump 63.

Furthermore, the bonding pad 51 provided on the substrate and the bump 63 provided on the semiconductor chip are thermocompression bonded under applied heat and pressure. Applying heat and pressure enables the bump 63 to quickly cause the plastic deformation and smoothly move into the through hole 51a, which surely increases the metallic bonding surface.

Next, the second embodiment will be explained in comparison with the prior art shown in FIGS. 19 to 22.

Figure 20:
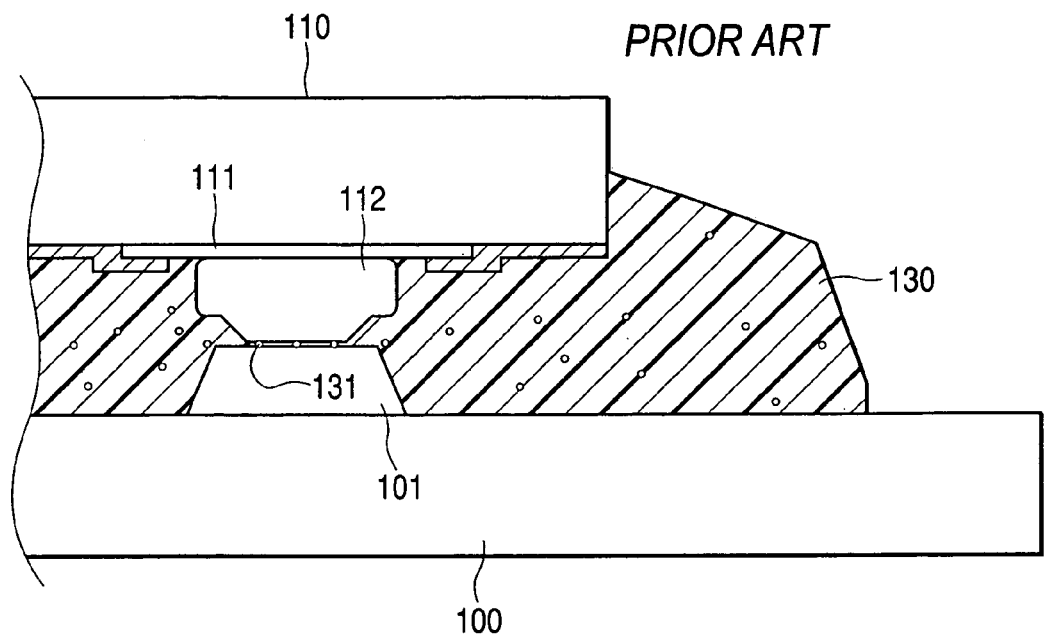
FIG. 20 is a vertical cross-sectional view showing another conventional flip chip packaged portion.
Figure 21:
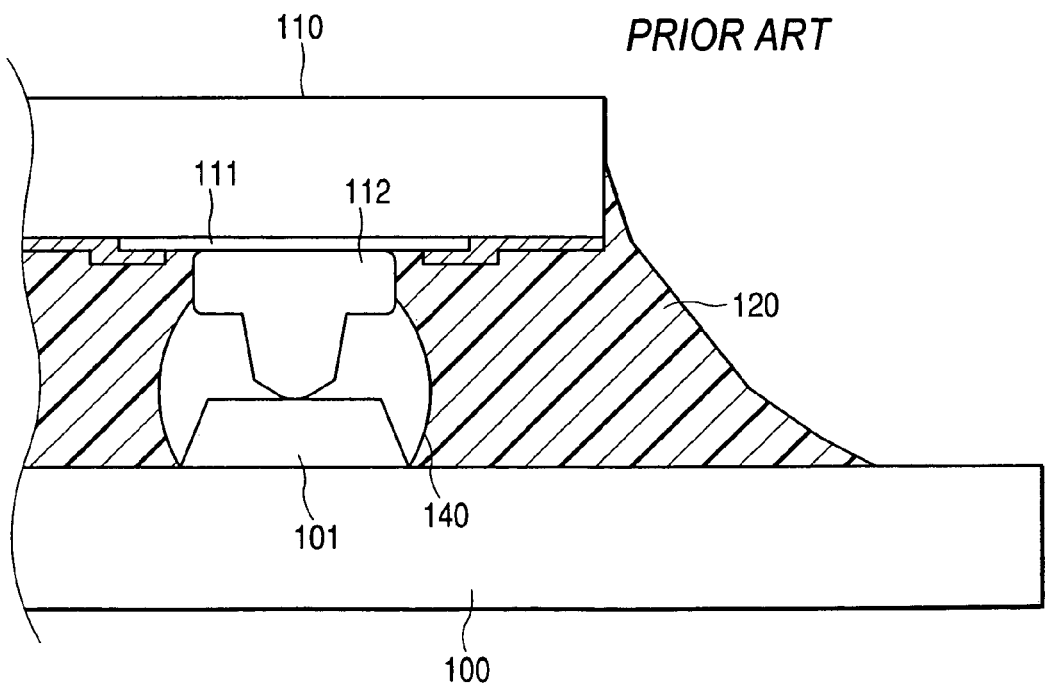
FIG. 21 is a vertical cross-sectional view showing another conventional flip chip packaged portion.

The flip chip bonding operation for a semiconductor chip can be explained with reference to FIG. 19. First, the bump 112 is formed on the active face of the semiconductor chip 110. Then, the bump 112 is connected with the bonding pad 101 provided on the interposer substrate 100 by thermocompression bonding or ultrasonic welding. Alternatively, as shown in FIG. 20, the bump 112 can be bonded with the bonding pad 101 provided on the interposer substrate 100 by using electro-conductive particles 131 contained in an anisotropic conductive material 130. Furthermore, as shown in FIG. 21, the bump 112 can be bonded with the bonding pad 101 provided on the interposer substrate 100 by using an electro-conductive material 140.

Figure 22A:
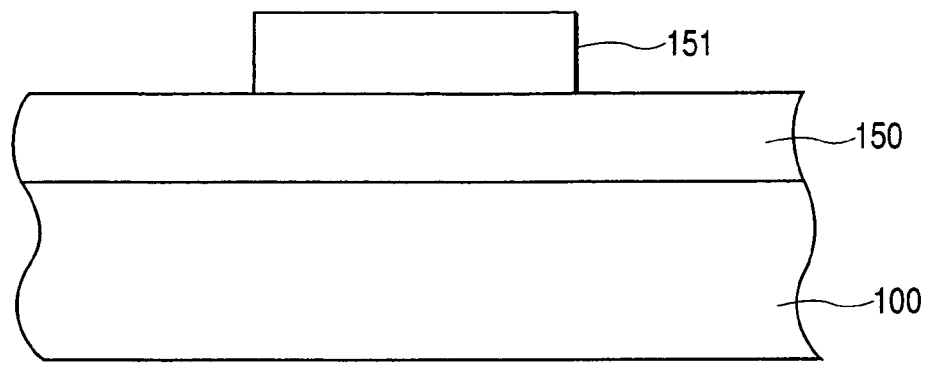
FIGS. 22A to 22C are views explaining the processes for forming a conventional substrate bonding pad.
Figure 22B:
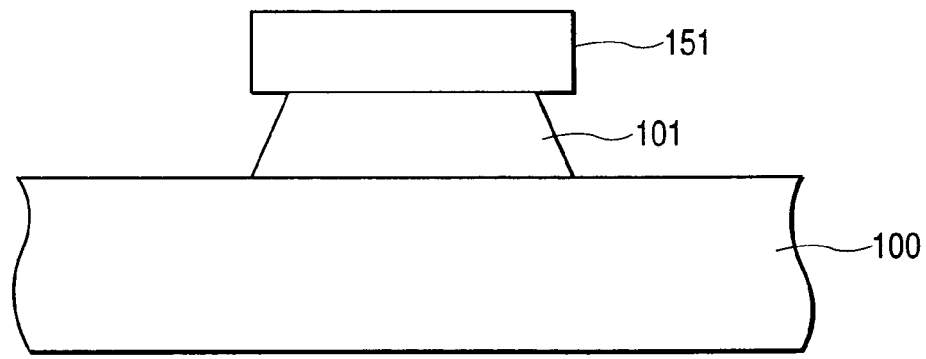
Figure 22C:
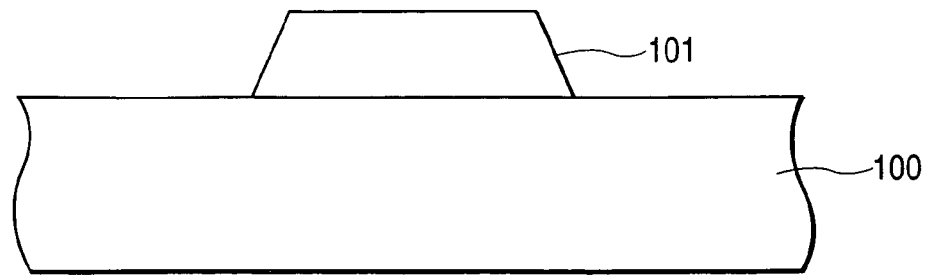

Furthermore, as a method of forming a wiring pattern (i.e. bonding pad) on the interposer substrate 100, it is possible to form a film 150 serving as a wiring and form a mask 151 on this film 150 as shown in FIG. 22A. Subsequently, the film 150 serving as a wiring is patterned with the mask 151 by etching so as to leave a pad 101 as shown in FIG. 22B. Finally, the mask 151 is removed as shown in FIG. 22C.

Figure 19:
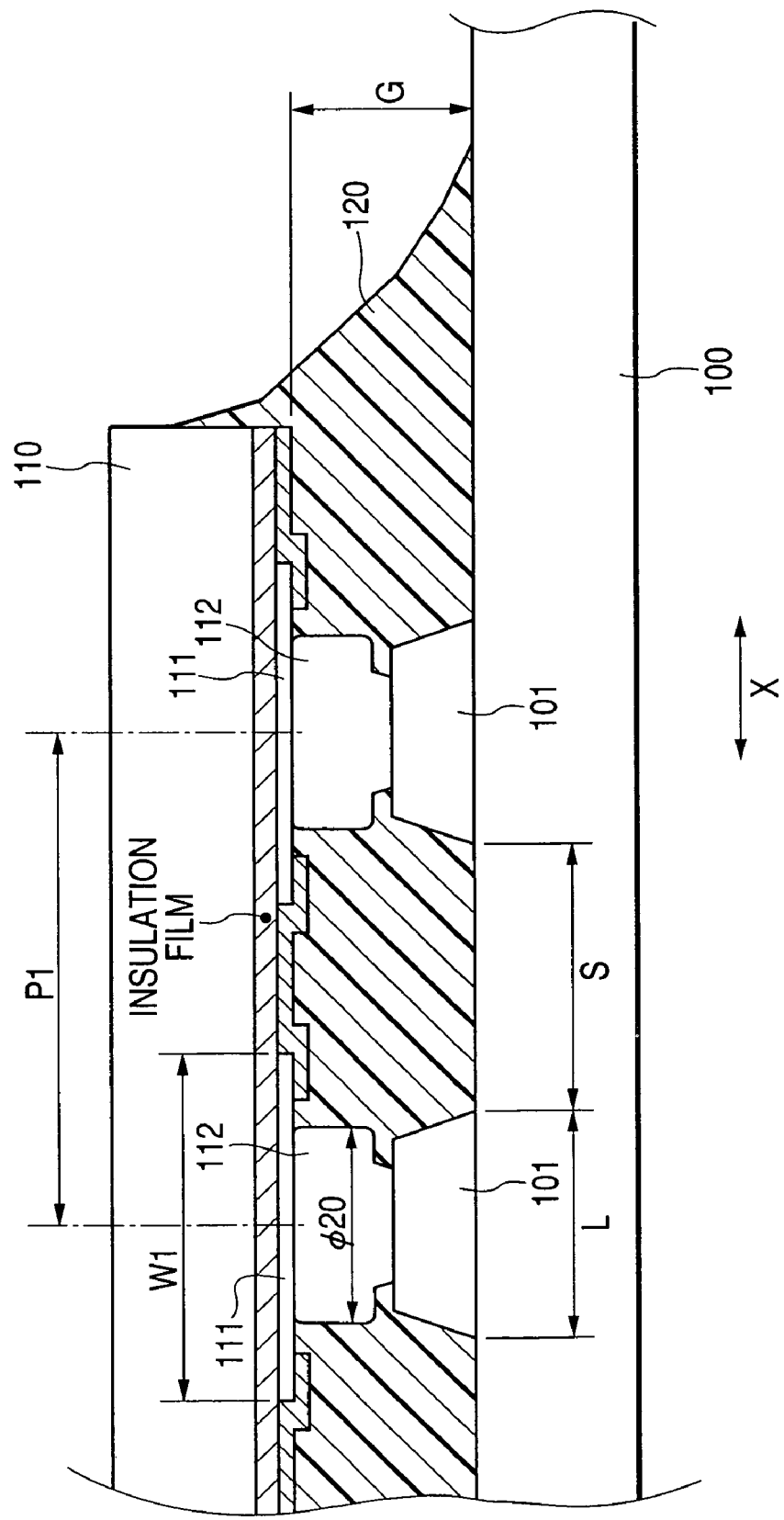
FIG. 19 is a vertical cross-sectional view showing a conventional flip chip packaged portion.

In the arrangement shown in FIG. 19, it is a recent trend that the semiconductor chip 110 is highly integrated and accordingly the size (i.e. electrode size) W1 of the pad 111 made of aluminum and a pitch (i.e. electrode size) P1 between two neighboring pads 111 are very small. When the semiconductor chip 110 is flip chip bonded to the interposer substrate 100 via the bump 112, it is necessary to adjust the size of the bonding pad 101 so as to correspond to the pitch (i.e. electrode size) P1 of the pad 111. The line width L of a wiring pattern (i.e. the width of the bonding pad 101 serving as part of the wiring pattern) formed on the interposer substrate 100 becomes small with decreasing pitch between neighboring bonding pads 111 provided on the semiconductor chip 110. The space S between neighboring lines becomes small proportionally.

For example, it is now assumed that the semiconductor chip 110 has the pad size (i.e. electrode size) W1 of 120 μm and the pitch P1 is 200 μm. In this case, the bump has the size Φ20 of approximately 100 μm in diameter when the bump shape is circular (or in vertical/lateral size when the bump shape is rectangular). The wiring pattern of the interposer substrate 100 can be formed so as to satisfy the relationship L/S=120 μm/80 μm. The width L of the bonding pad 101 is 120 μm. On the other hand, the method of using the etching for forming the wiring pattern as shown in FIGS. 22A to 22C is not expensive. According to this method, the wiring pattern has a trapezoidal shape in cross section. The width of this wiring pattern at the bottom (i.e. lower surface) is different from the width of the wiring pattern at the top (i.e. upper surface). If the metal layer (150), such as Cu, forming the wiring pattern has the thickness of 15 μm, its width will be 100 μm at the top and 120 μm at the top. Accordingly, to obtain a satisfactory bonding area, it is preferable that the bump 112 has the size of 100 μm so as to agree with the width (100 μm) of the upper surface of the bonding pad 101.

On the other hand, it is now assumed that the pad 111 has the size (i.e. electrode size) W1 of 90 μm and the pitch P1 of 110 μm. In this case, the bump size Φ20 is approximately 70 μm in diameter when the bump shape is circular (or in vertical/lateral size when the bump shape is rectangular). If the wiring pattern of the interposer substrate 100 is formed so as to satisfy the relationship L/S=60 μm/50 μm, the upper surface of the bonding pad 101 will be 45 μm and accordingly it is difficult to obtain a sufficient bonding area.

The method of using the plating for forming the wiring pattern is advantageous in reducing the difference between the top width and the bottom width of the wiring pattern. However, the method of using the plating is expensive compared with the method of using the etching. Furthermore, even if the plating is used to form the wiring pattern, the upper surface of the bonding pad 101 will be 60μm to satisfy the previously described condition L/S=60/50. For example, when this device is installed in an automotive vehicle, it is impossible to obtain a sufficient bonding area for satisfying the bonding reliability.

Furthermore, the bonding surface between the bonding pad 101 and the bump 112 is parallel to the shearing direction X of a thermal stress to be produced due to a thermal expansion coefficient difference between the interposer substrate 100 and the semiconductor chip 110. Therefore, the thermal stress possibly damages the bonding between them.

On the other hand, this embodiment forms the through hole 51a extending vertically across the bonding pad 51 provided on the substrate as shown in FIGS. 14A and 14B. The inner surface of the through hole 51a can be used as a bonding portion to be bonded with the bump 63.

More specifically, as shown in FIG. 13, this embodiment forms the bonding pad 51 having the through hole 51a on the interposer substrate 50. The through hole 51a of bonding pad 51 has the center agreeing with the bonding point of the bump 63 and having the width Φ11 narrower compared with the maximum diameter Φ of the bump 63. According to the arrangement of this embodiment, it is possible to increase the bonding area between the bonding pad 51 and the bump 63 as shown in FIG. 10. Furthermore, according to the arrangement of this embodiment, it is possible to form a bonding surface not parallel to the shearing direction X of the thermal stress to be produced due to a thermal expansion coefficient difference between the interposer substrate 50 and the semiconductor chip 60. Thus, this embodiment can improve the bonding reliability between the semiconductor chip and the substrate.

Preferably, the bump 63 is a stud bump that is formed by placing a gold ball formed with the discharge onto the aluminum bonding pad (or an Au plating layer formed on an aluminum bonding pad) 61 formed on an active face of the semiconductor chip 60 and anchoring this gold ball onto the bonding pad 61 under given heat or ultrasonic wave. The stud bump is tall and soft compared with the plating bump and therefore can deform largely. Hence, through the flip chip bonding operation, the bump 63 surely causes plastic deformation and easily bonds together with the through hole 51a of the bonding pad 51.

Furthermore, instead of using the etching for forming the through hole 51a shown in FIG. 10, it is possible to use the pattern formation based on the plating. Namely, the bonding pad 51 having the through hole 51a can be formed by plating. In this case, forming a hole in the bonding pad 51 so as to agree with the bonding center of the bump 63 can be carried out during a manufacturing process of forming a general interposer substrate. In this case, a flat portion formed on the upper surface of the bonding pad 51 is stable in its area, which stably provides the bonding area.

Furthermore, as another method of forming the through hole 51a, a cutting operation using a drill or a press operation using a die can be employed to mechanically form the through hole. Furthermore, the trimming based on irradiation of a laser beam can be also used to form the through hole. In any case, the through hole 51a can be formed accurately.

In this case, after forming the through hole 51a by etching or pressing using a die, or trimming based on the laser irradiation, it is preferable to form a nickel (Ni) plating base layer on the surface of the through hole 51a and then form a gold (Au) plating layer or the like on this base layer.

Furthermore, the through hole 51a shown in FIGS. 11A and 11B can be replaced with a recess. In this case, the insulation layer of the interposer substrate 50 is not exposed in the bottom of the recess. Furthermore, the flat portion needs not be formed on the upper surface of the bonding pad 51.

The through hole 51a shown in FIGS. 11A and 11B can be replaced with a through hole 55a shown in FIGS. 14A and 14B. According to the arrangement shown in FIGS. 11A and 11B, the outer circumferential periphery of the through hole 51a is completely surrounded by a flat top surface of the pad 51. On the other hand, according to the arrangement shown in FIGS. 14A and 14B, the through hole 55a (or a recess) has a notched shape opened to an end surface, i.e., inclined outer side surface other than the flat top surface, of the bonding pad 55 provided on the substrate. Using the notched through hole 55a (or a recess) is advantageous in that a vacant space in the through hole 55a is not hermetically closed when such a space is left at the bottom of the through hole 55a (or recess) after a bonding operation is accomplished. In other words, the bonding reliability is not lessened due to expansion or contraction of a closed space occurring when the temperature changes. Furthermore, as shown in FIGS. 14A and 14B, in a case that the notched through hole 55a (or recess) extends in the Y direction, the bonding area can be stably obtained even when the bump 63 dislocates in the Y direction relative to the through hole 55a (or recess) due to inaccuracy of the flip chip packaging operation.

Figure 15A:
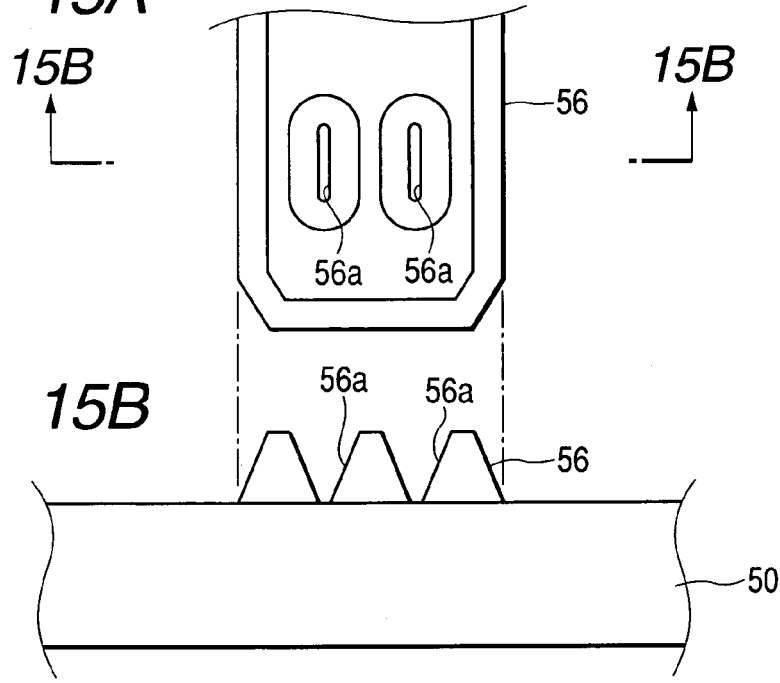
FIG. 15A is a plan view showing another substrate in accordance with the second embodiment of the present invention.
Figure 15B:
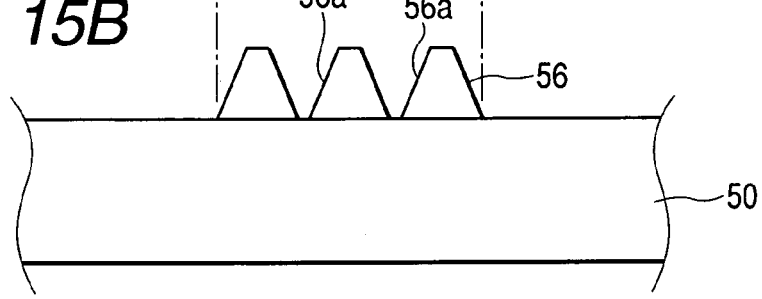
FIG. 15B is a cross-sectional view showing the substrate in accordance with the second embodiment of the present invention, taken along a line 15B—15B of FIG. 15A.

Furthermore, the through hole 51a shown in FIGS. 11A and 11B can be replaced with through holes 56a shown in FIGS. 15a and 15B. According to the arrangement shown in FIGS. 15a and 15B, plural through hole 56a (or recesses) are formed against a single pad 56. In this case, the bonding area can be further increased.

Figure 16:
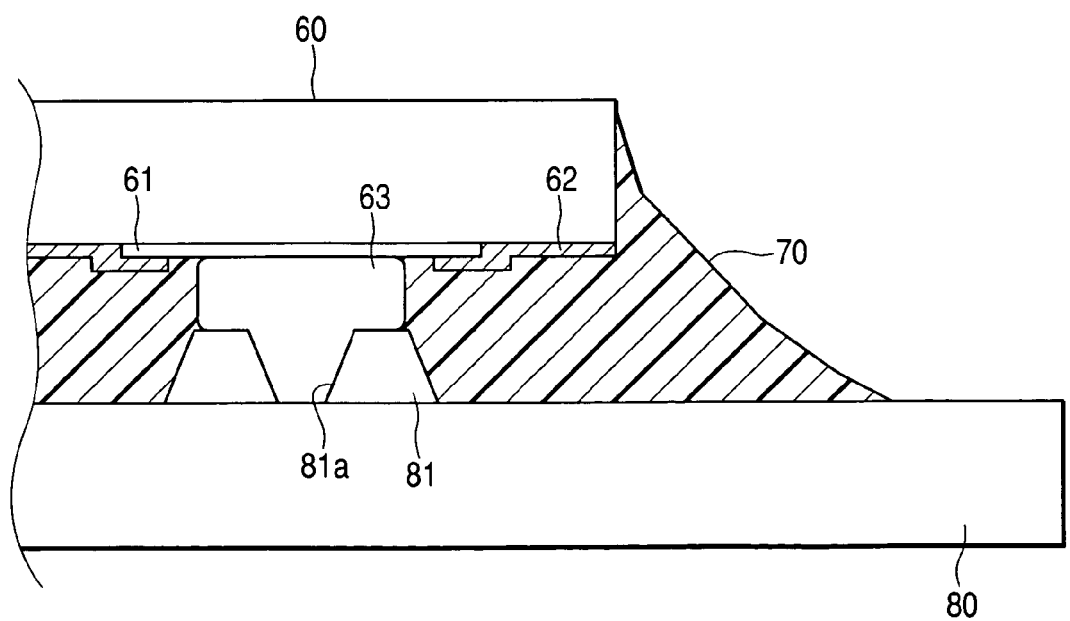
FIG. 16 is a vertical cross-sectional view showing a modified flip chip packaged portion in accordance with the second embodiment of the present invention.

Furthermore, as shown in FIG. 16, this embodiment can be applied to an arrangement including no interposer substrate for packaging the semiconductor chip 60 with a circuit substrate 80. In other words, the substrate of this arrangement can be used as the circuit substrate 80. According to the arrangement shown in FIG. 16, the chip bonding pad (i.e. chip electrode) 61 provided on the semiconductor chip 60 is electrically and mechanically bonded via the bump 63 with a bonding pad (substrate electrode) 81 provided on the circuit substrate 80. A through hole 81a (or recess) of the bonding pad 81 provided on the circuit substrate 80 brings the effect of increasing the bonding area.

According to the arrangement shown in FIG. 13, the bump 63 provided on the semiconductor chip is thermocompression bonded with the bonding pad 51 provided on the substrate under applied heat and pressure. However, as another flip chip bonding method, it is preferable to use ultrasonic vibration in addition to heat and pressure. The metallic bonding will be accomplished at lower temperatures within a relatively short time. Using the ultrasonic wave is advantageous in that the bonding time can be shortened. Furthermore, it becomes possible to realize a low-temperature bonding operation capable of suppressing the heating temperature.

Figure 17:
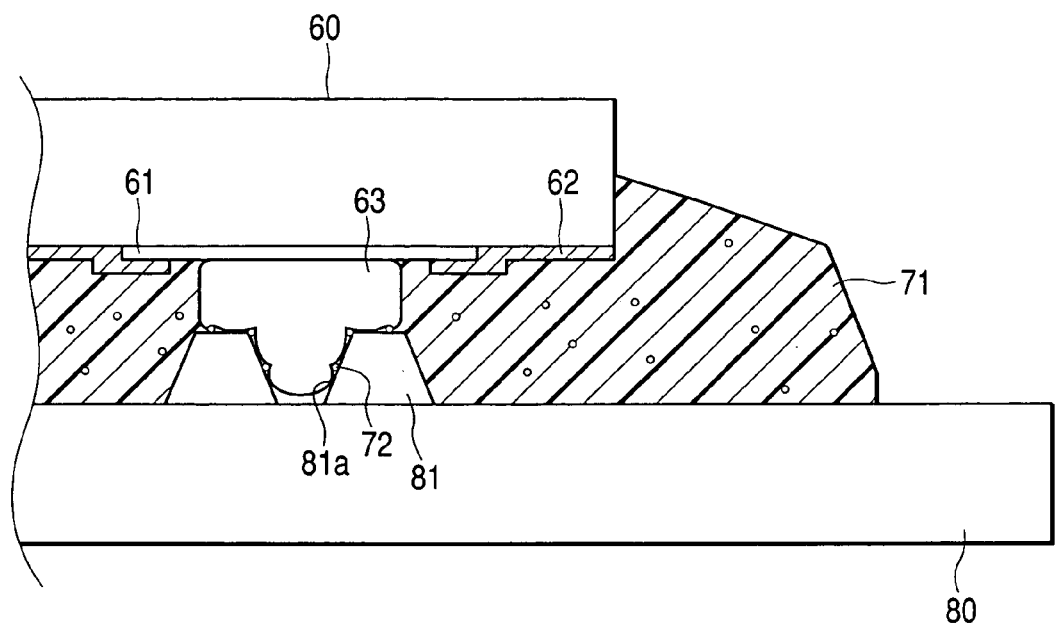
FIG. 17 is a vertical cross-sectional view showing another modified flip chip packaged portion in accordance with the second embodiment of the present invention.
Figure 18:
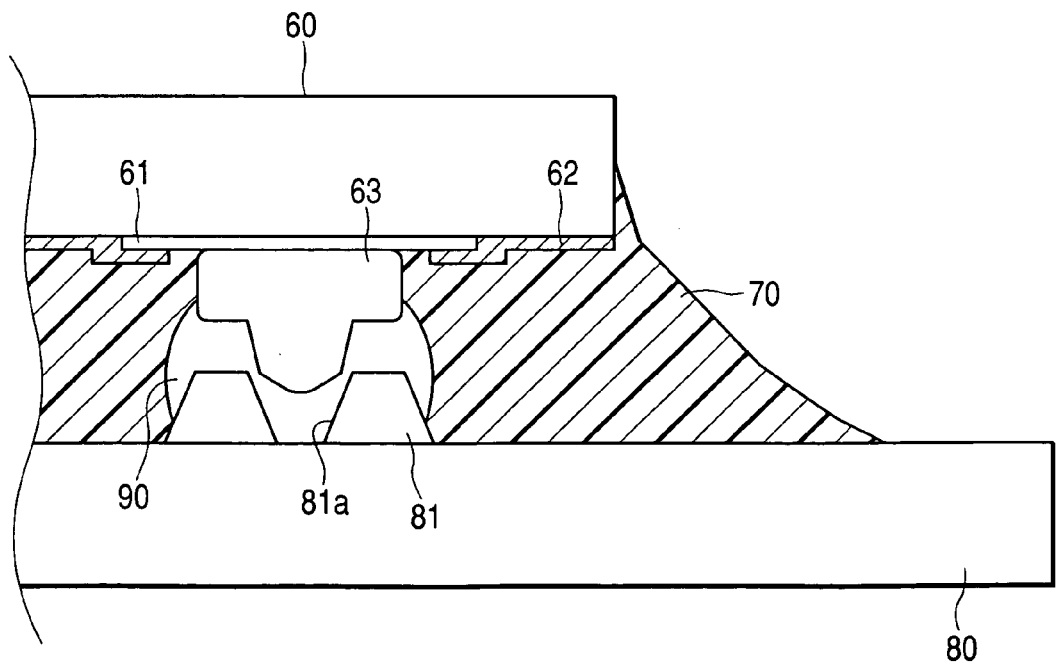
FIG. 18 is a vertical cross-sectional view showing another modified flip chip packaged portion in accordance with the second embodiment of the present invention.

Furthermore, as shown in FIG. 17, it is possible to use an anisotropic conductive material 71 as a bonding member. According to this arrangement, a large interface is provided between the through hole 81a and the bump 63, which can easily trap electro-conductive particles 72 contained in the anisotropic conductive material 71. Thus, an adequate and stable bonding resistance is obtained. Furthermore, as shown in FIG. 18, it is preferable to use an electro-conductive material 90, such as a solder paste or a silver (Ag) paste. Even in this case, the bonding area of the bonding pad 81 is large because the conductive material 90 enters into the through hole 81a. The bonding reliability can be improved.

In any of the thermocompression bonding, the ultrasonic welding, and the bonding using the conductive material 90, it is desirable to fill the space interposing the semiconductor chip and the substrate with an underfill member or an adhesive (epoxy or comparable thermosetting resin) 70 to reinforce the bonding portion.

What is claimed is:

1. A flip chip packaging structure comprising:
   a semiconductor chip;
   a substrate;
   a first bonding pad provided on a surface of the semiconductor chip;
   a second bonding pad provided on the substrate;
   a passivation film formed to cover the first bonding pad such that a plurality of apertures are opened on the passivation film so as to expose a plurality of portions of said first bonding pad through the apertures, respectively;
   a plurality of first bumps, respectively, disposed on the portions of the first bonding pad through the apertures such that the first bumps are spaced apart from one another so as to form a clearance space;
   a second bump disposed on the second bonding pad and bonded to the first bumps such that the second bump enters into the clearance space so as to form a three-dimensional bonding boundary surface between the second bump and the plurality of first bumps bonded to each other, wherein the first and second bonding pads are electrically and mechanically connected with each other through the first and second bumps.

2. The flip chip packaging structure in accordance with claim 1, wherein said first bumps disposed on the first bonding pad of said semiconductor chip are formed by plating.

3. The flip chip packaging structure in accordance with claim 1, wherein said second bump disposed on the second bonding pad of said substrate is a stud bump formed by anchoring a gold ball formed with the discharge onto said second bonding pad provided on said substrate.

4. The flip chip packaging structure in accordance with claim 1, wherein said semiconductor chip is faced down when it is mounted, and then heat and pressure are added to the second bump to cause said second bump to plastically deform and then enter into said clearance space of said first bumps.

5. The flip chip packaging structure in accordance with claim 1, wherein said semiconductor chip is faced dawn when it is mounted, and then heat, pressure, and ultrasonic vibration are added to the second bump to cause said second bump to plastically deform and then enter into said clearance of said first bumps.

6. The flip chip packaging structure in accordance with claim 1, further comprising:
   an underfill member filling an open space intervening between said semiconductor chip and said substrate.

7. The flip chip packaging structure in accordance with claim 1, wherein said substrate is a circuit substrate.

8. The flip chip packaging structure in accordance with claim 1, wherein said substrate is an interposer substrate of a semiconductor package.

9. The flip chip packaging structure in accordance with claim 1, wherein the second bump has a tapered projection entered into the clearance space of the first bumps, and the tapered projection of the second bump is narrowed along a direction from the substrate to the semiconductor chip.

10. The flip chip packaging structure in accordance with claim 1, wherein the first bumps have a plurality of side walls facing the clearance space, and the side walls of the first bumps define a part of the three-dimensional bonding boundary surface.

* * * * *